(12) United States Patent
Choi et al.

(10) Patent No.: US 7,160,777 B2
(45) Date of Patent: Jan. 9, 2007

(54) SPLIT-GATE NONVOLATILE MEMORY DEVICE AND METHOD OF MANUFACTURING THE SAME

(75) Inventors: Yong-Suk Choi, Seoul (KR); Seung-Beom Yoon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 260 days.

(21) Appl. No.: 10/916,670

(22) Filed: Aug. 11, 2004

(65) Prior Publication Data
US 2005/0051836 A1    Mar. 10, 2005

(30) Foreign Application Priority Data
Sep. 9, 2003    (KR) ...................... 10-2003-0063356

(51) Int. Cl.
*H01L 21/336*    (2006.01)
(52) U.S. Cl. ...................................... 438/267; 257/315
(58) Field of Classification Search ................ 438/201, 438/211, 257, 267, 299, 593, 596; 257/315–317, 257/320–321, E21.209, E21.422, E29.129
See application file for complete search history.

(56) References Cited

U.S. PATENT DOCUMENTS 6,773,993 B1*    8/2004    Lin et al. .................... 438/267

\* cited by examiner

*Primary Examiner*—David Vu
(74) *Attorney, Agent, or Firm*—Marger Johnson & McCollom, P.C.

(57) ABSTRACT

Embodiments of the invention include a gate insulating layer formed on a semiconductor substrate; a spacer-type floating gate and a spacer-type dummy pattern, which are formed on the gate insulating layer and separated apart from each other, the floating gate and the dummy pattern having round surfaces that face outward; a pair of insulating spacers, which are formed on a sidewall of the floating gate and a sidewall of the dummy pattern which face each other; a control gate formed in a self-aligned manner between the pair of insulating spacers; a tunnel insulating layer interposed between the floating gate and the control gate; and source and drain regions formed in the semiconductor substrate outside the floating gate and the dummy pattern.

10 Claims, 9 Drawing Sheets

SPLIT-GATE NONVOLATILE MEMORY DEVICE AND METHOD OF MANUFACTURING THE SAME

CROSS REFERENCE TO RELATED APPLICATIONS

This application claims priority from Korean Patent Application No. 2003-63356, filed on Sep. 9, 2003, in the Korean Intellectual Property Office, the contents of which are hereby incorporated by reference in their entirety for all purposes.

BACKGROUND OF THE INVENTION

1. Field of the Invention

This disclosure relates to a split-gate nonvolatile semiconductor memory device and a method of manufacturing the same. More particularly, the disclosure relates to a split-gate nonvolatile semiconductor memory device, in which a control gate is formed in a self-aligned manner, and a method of manufacturing the same.

2. Description of the Related Art

As a nonvolatile memory device can electrically erase and store data and retain data even if power supply is interrupted, the nonvolatile memory device has increasingly been applied in various fields such as mobile communication systems and memory cards. The nonvolatile semiconductor memory device includes a transistor, which can be categorized as a stack-gate transistor or a split-gate transistor. The stack-gate transistor includes a floating gate, an insulating layer, and a control gate, which are sequentially stacked, and the split-gate transistor includes a split-gate structure.

FIG. 1 is a cross-sectional diagram illustrating a conventional nonvolatile semiconductor memory device with a split-gate transistor (hereinafter, referred to as a "split-gate memory device").

Referring to FIG. 1, in the conventional split-gate memory device, a source region 15 is formed in a predetermined region of a semiconductor substrate 10, and a pair of floating gates 20 is disposed adjacent to each other on the semiconductor substrate 10 on both sides of the source region 15. A top surface of each of the floating gates 20 is covered by an elliptical oxide layer 25. A sidewall of each of the floating gates 20 on the opposite side of the source region 15 is covered by a control gate 30. The control gate 30 extends from the sidewall of the floating gate 20, covers a top surface of the elliptical oxide layer 25 in one direction, and covers a portion of the semiconductor substrate 10 outside the floating gate 20 on the opposite side of the source region 15 in another direction. A drain region 35 is formed in the semiconductor substrate 10 adjacent to the control gate 30. A portion of the control gate 30 overlaps the drain region 35. A gate insulating layer 40 is formed between the floating gate 20 and the semiconductor substrate 10. The gate insulating layer 40, which is under a bottom of the floating gate 20, is also under a tunnel insulating layer 45. A portion of the tunnel insulating layer 45 extends from the sidewall of the floating gate 20 and is located between the control gate 30 and the semiconductor substrate 10. The tunnel insulating layer 45 is patterned to conform to the shape of the control gate 30.

As described above, the split-gate memory device includes the floating gate 20 and the control gate 30, which are separated from each other. The floating gate 20 has an electrically isolated structure. Electrons are injected into the floating gate 20 to write data, and the electrons are emitted from the floating gate 20 to erase data. Data is stored in a memory cell using a change of a cell current that is caused by the injection or emission of electrons. In a write mode, if a high voltage (e.g., 15 V or higher) is applied to the source region 15 and an appropriate voltage is applied to the drain region 35, hot electrons are injected from the semiconductor substrate 10, which is positioned below the floating gate 20 adjacent to the control gate 30, via the gate insulating layer 40 into the floating gate 20. In an erase mode, if a voltage of 15 V or higher is applied to the control gate 30, a high electric field is applied to tips of the floating gate 20 such that the electrons are emitted from the floating gate 20 and injected into the control gate 30. Hence, the injection of electrons into the floating gate 20 is performed using channel hot electron injection (CHEI), while the emission of electrons from the floating gate 20 is performed by Fowler-Nordheim tunneling through the tunnel insulating layer 45 between the floating gate 20 and the control gate 30.

The foregoing split-gate memory device can be manufactured by, for example, the following method. Initially, a gate insulating layer 40 is formed on an entire surface of a semiconductor substrate 10. A first polysilicon layer is formed to a predetermined thickness on the gate insulating layer 40 and then patterned using a photolithography process. Next, the first polysilicon layer is thermally oxidized. Then, the floating gate 20 and an elliptical oxide layer 25, which covers a top surface of the floating gate 20, are formed.

Thereafter, an insulating layer is formed on the entire surface of the semiconductor substrate 10 where the elliptical oxide layer 25 is formed, using chemical vapor deposition (CVD) or the like. The insulating layer is patterned using a photolithography process to thereby form a tunnel insulating layer 45 as shown in FIG. 1.

Thereafter, a process of forming a control gate 30 is performed. For example, to form a polysilicon control gate 30, a second polysilicon layer is formed by depositing polysilicon conformally on the resultant structure where the tunnel insulating layer 45 is formed and patterned.

As described above, in the conventional method, a photolithography process is used to pattern the control gate 30 and the floating gate 20 and define the lengths and sizes thereof. However, a misalignment and a loading effect may occur during the photolithography process, and the misalignment may cause a large variation in the overlap length.

A misalignment causes a difference in the effective channel length of the control gate 30 between cells. Thus, two cells, i.e., an even cell and an odd cell, which are disposed symmetrically in mirror-image relations as shown in FIG. 1, have different characteristics since the effective channel length of the even cell L1 differs from the effective channel length of the odd cell L2. This variation in the effective channel length of the control gate 30 leads to a variation in the threshold voltage of memory cells. Also, since the size of the floating gate 20 is defined by the photolithography process, it is very difficult to scale down the floating gate 20 below the exposure limit of a photolithography apparatus.

Embodiments of the invention address these and other disadvantages of the conventional art.

SUMMARY OF THE INVENTION

Embodiments of the invention provide a split-gate memory device in which memory cells can be scaled down. Embodiments of the invention also provide a method of manufacturing a split-gate memory device, in which a control gate is formed in a self-aligned manner.

According to embodiments of the invention, since a floating gate is formed in the shape of a spacer, a memory cell is not affected by the exposure limit of a photolithography process and can be greatly scaled down. Also, since embodiments of the invention utilize a self-alignment process, a variation in the length of a control gate is minimized. Accordingly, cells may have uniform operating characteristics.

BRIEF DESCRIPTION OF THE DRAWINGS

The above and other features and advantages of the invention will become more apparent by describing in detail exemplary embodiments thereof with reference to the attached drawings.

DETAILED DESCRIPTION OF THE INVENTION

Figure 1:
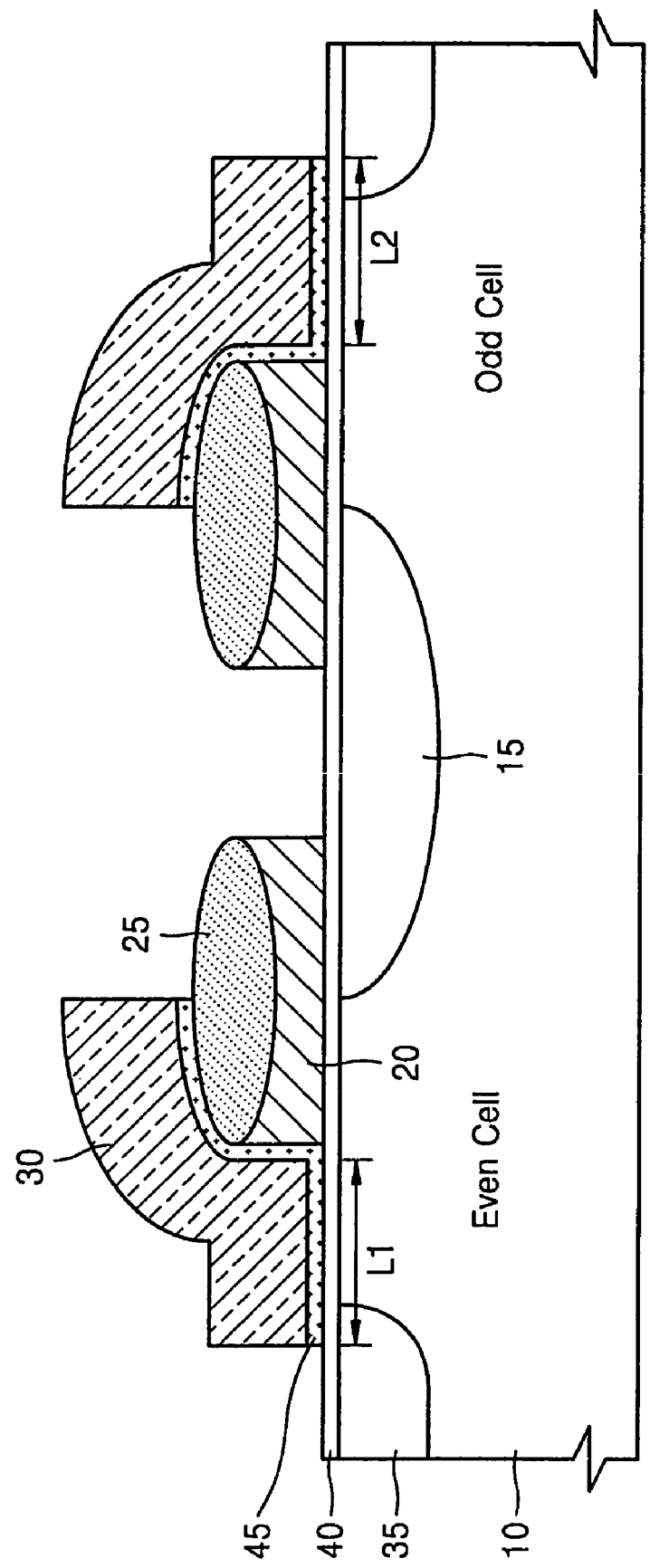
FIG. 1 is a cross-sectional diagram illustrating a conventional split-gate nonvolatile semiconductor memory device.

The invention will now be described more fully with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. To facilitate understanding, identical reference numerals have been used, where possible, to designate elements that are common to the figures.

Figure 2:
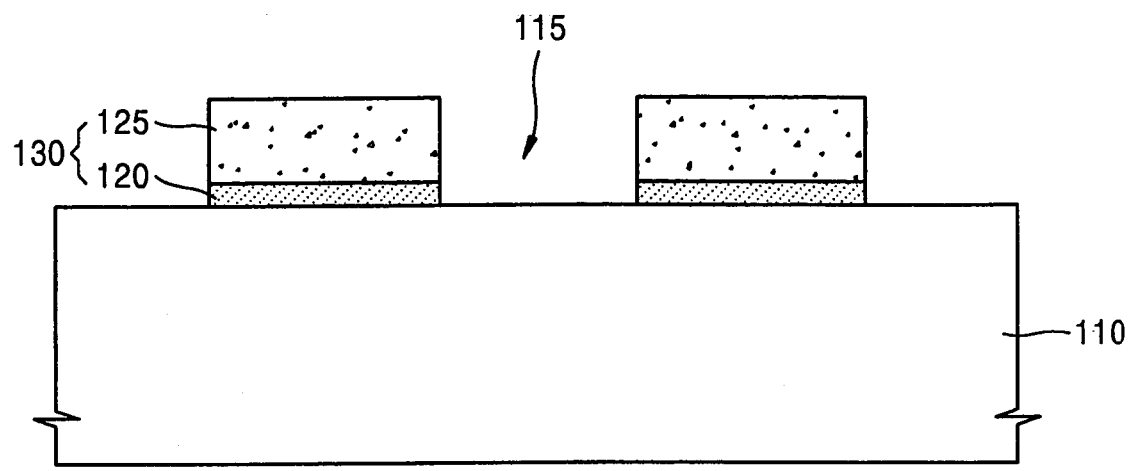
FIGS. 2 through 12 are cross-sectional diagrams illustrating a method of manufacturing a split-gate nonvolatile semiconductor memory device according to an embodiment of the invention.

Referring to FIG. 2, insulating patterns 130 are formed on a semiconductor substrate 110 and separated from each other by an opening 115. Each of the insulating patterns 130 can be formed of a stack of two or more layers that have a high etch selectivity with respect to each other. Preferably, each of the insulating patterns 130 is a stack of an oxide layer 120 and a nitride layer 125. The forming of the insulating patterns 130 includes depositing the oxide layer 120 and the nitride layer 125 on the entire surface of the semiconductor substrate 110, forming a first photoresist pattern (not shown) to define the opening 115, patterning the oxide layer 120 and the nitride layer 125 using the first photoresist pattern, and removing the first photoresist pattern using ashing and stripping. An oxynitride layer can be used instead of the nitride layer 125. Since a floating gate will be formed on sidewalls of the insulating patterns 130 in a subsequent process, the thickness of the insulating patterns 130 determines the height of the floating gate. Accordingly, the thicknesses of the oxide layer 120 and the nitride layer 125, which constitute the insulating patterns 130, are determined considering the height of the floating gate.

The oxide layer 120 can be a silicon oxide layer and formed using a typical deposition method, for example, CVD, Sub-Atmospheric CVD (SACVD), Low-Pressure CVD (LPCVD), or Plasma-Enhanced CVD (PECVD) or thermal oxidation. If the CVD is used, the oxide layer 120 can be formed of middle-temperature oxide (MTO) using $SiH_4$ gas, $Si_2H_6$ gas, and $N_2O$ gas as a reaction gas. The oxide layer 120 is formed to an appropriate thickness, for example, about 500 Å to 1000 Å, considering the height of a floating gate and the size of a memory device.

The nitride layer 125 can be a silicon nitride layer and formed at a temperature of about 500° C. to 850° C. by LPCVD using a reaction of $SiH_4$ with $NH_3$. Like the oxide layer 120, the nitride layer 125 is formed to an appropriate thickness, for example, about 1000 Å to 3000 Å, considering the height of the floating gate and the size of the memory device. The patterning of the nitride layer 125 can be performed using a fluorocarbon gas. The fluorocarbon gas is a CxFy gas or a CaHbFc gas, for example, $CF_4$, $CHF_3$, $C_2F_6$, $C_4F_6$, $C_4F_8$, $CH_2F_2$, $CH_3F$, $CH_4$, $C_2H_2$, $C_4F_6$, or any combination thereof. Here, an Ar gas can be used as an atmospheric gas.

Figure 3:
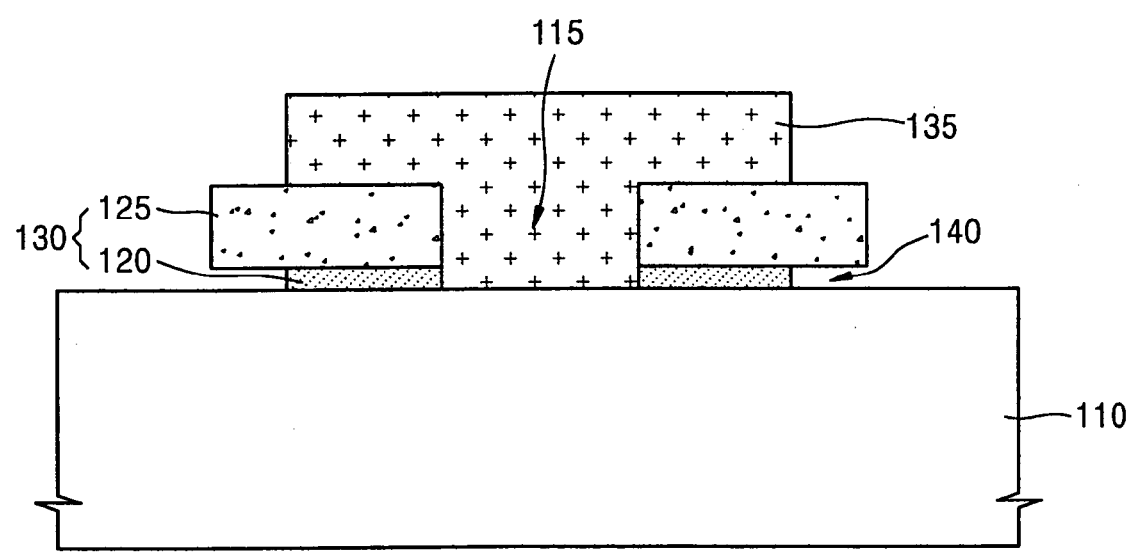

Referring to FIG. 3, a second photoresist pattern 135 is formed to protect a portion of the oxide layer 120 adjacent to the opening 115. An exposed portion of the oxide layer 120 on the opposite side of the opening 115 is wet etched to thereby form an undercut 140. For example, the sidewall of the oxide layer 120 is exposed to a HF diluted solution so as to form the undercut 140. The HF diluted solution can be a mixture of HF and deionized water ($H_2O$) in a ratio of 1:5 to 1:1000. A Buffered oxide etchant (BOE) can be used instead of the HF diluted solution. Since the oxide layer 120 has a high etch selectivity with respect to the nitride layer 125, only the oxide layer 120, not the nitride layer 125, is etched by a wet etch process to form the undercut 140. Subsequently, a portion of a floating gate is formed in the undercuts 140. Thus, since the depth of the undercut 140 is used to define the size of the floating gate, the undercuts 140 are preferably formed considering the size of the floating gate. In the present embodiment, the undercut 140 is formed to a depth of, for example, about 50 nm to 100 nm. After the undercut 140 is formed, the second photoresist pattern 135 is removed.

The insulating pattern 130 need not be formed of a stack of an oxide layer 120 and a nitride layer 125 to form the undercut 140. For example, if the insulating pattern 130 is formed of a single insulating layer, the undercut 140 can be formed by removing a portion of a lower portion of the insulating pattern 130.

Figure 4:
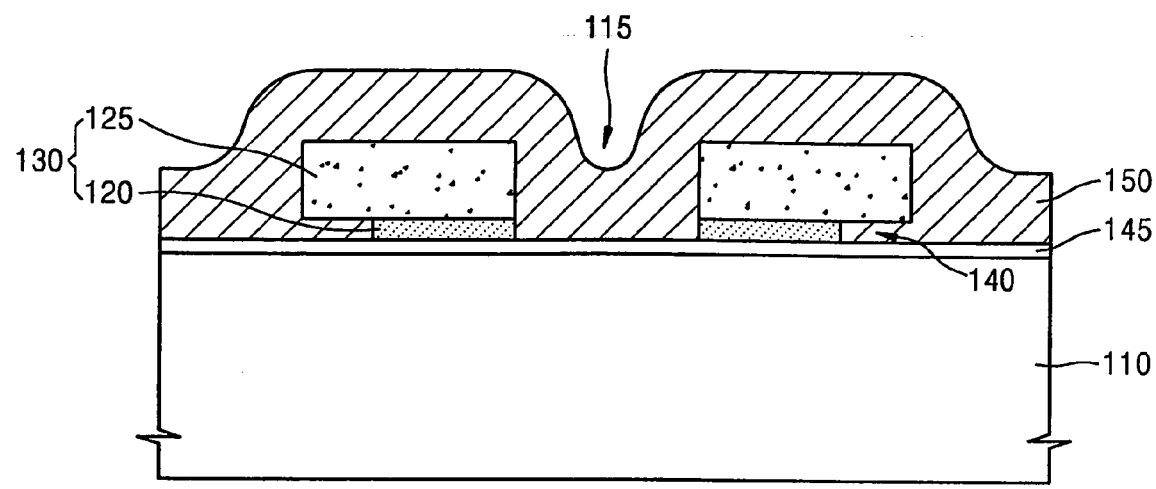

Referring to FIG. 4, a gate insulating layer 145 is formed on the entire surface of the semiconductor substrate 110 between the semiconductor substrate 110 and the insulating patterns 130. The gate oxide layer 145 can be a thermal oxide layer. A polysilicon layer 150 is formed on the entire surface of the resultant structure where the gate oxide layer 145 is formed. The polysilicon layer 150 is deposited using LPCVD to improve a step coverage characteristic such that the undercut 140 is filled. The polysilicon layer 150 is formed to such a thickness that the opening 115 is not completely filled with the polysilicon layer 150, because the polysilicon layer 150 will be anisotropically etched in the shape of spacers in a subsequent process. Like the depth of the undercut 140, the width of the spacers that are formed by anisotropically etching the polysilicon layer 150 is used to define the size of a floating gate. Since the thickness of the polysilicon layer 150 determines the width of the spacers, the polysilicon layer 150 should be formed to an appropriate thickness to form a desired size of floating gate. For example, the polysilicon layer 150 is formed to a thickness of about 1000 Å to 3000 Å. The polysilicon layer 150 can be deposited and doped with impurities at the same time in situ. Alternatively, an undoped polysilicon can be formed beforehand and then doped with impurities later. Here, phosphorus (P) ions can be implanted into the polysilicon layer 150 at an energy of about 30 KeV and at a dose of about $2.7 \times 10^{14}$ ions/cm$^2$.

Figure 5:
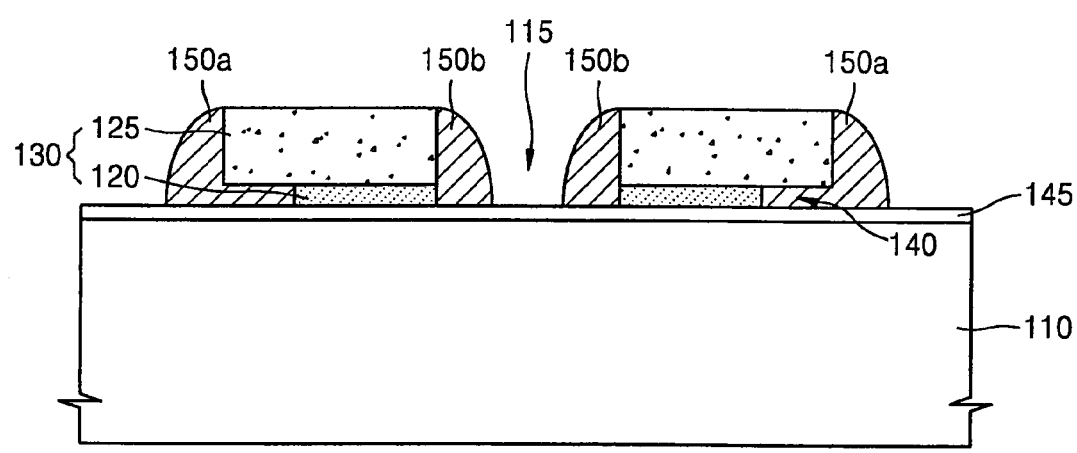

Thereafter, the polysilicon layer 150 is anisotropically etched to thereby form a spacer-type floating gate 150a and a spacer-type dummy pattern 150b on sidewalls of the insulating pattern 130 as shown in FIG. 5. The polysilicon layer 150 can be etched using a gas mixture of HBr, $O_2$, $N_2$, and $CF_4$ as an etch gas. A bias power may be applied toward the silicon substrate 110 to make the etch gas to go straight. As shown in FIG. 5, the spacer-type floating gate 150a formed on the opposite side of the opening 115 are formed to fill the undercut 140. The spacer-type floating gate 150a of the present embodiment is formed without using a photolithography process and so is not affected by the exposure limit of a photolithography apparatus. Accordingly, because the floating gate 150a can be further scaled down, memory cells can be scaled down.

Figure 6:
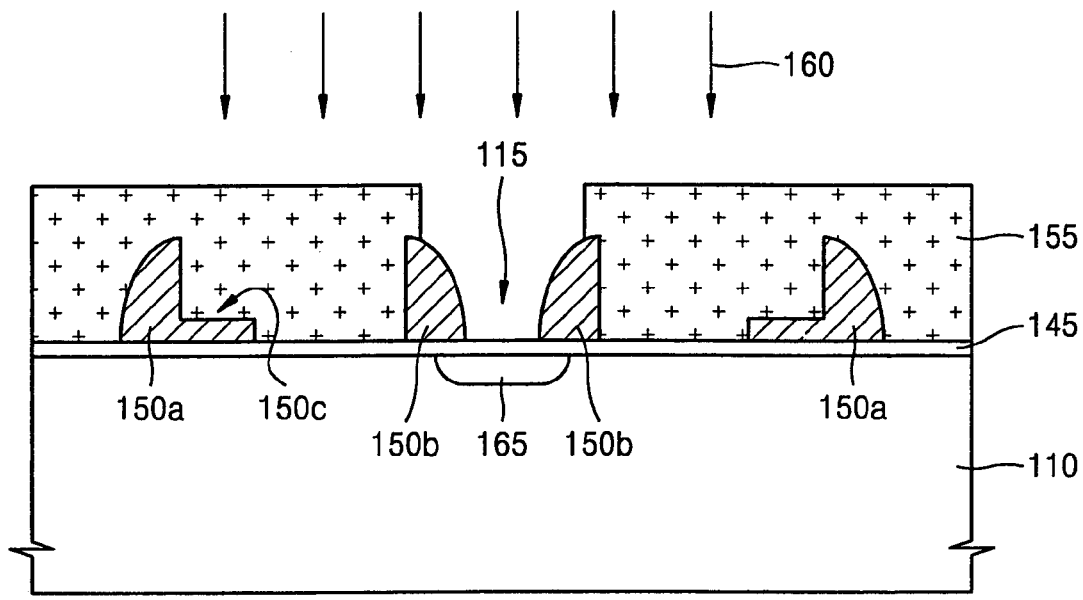

Referring to FIG. 6, the insulating patterns 130 are removed. Then, an extending portion 150c of the spacer-type floating gate 150a, which covers a portion of the gate oxide layer 145, is exposed. The size of the spacer-type floating gate 150a corresponds to the sum of the lengths of the spacer and the extending portion 150c. Thus, the size of the spacer-type floating gate 150a can be controlled by adjusting the size of the spacer and/or the length of the extending portion 150c (i.e., the depth of the undercut 140). Thereafter, a third photoresist pattern 155 is formed such that the opening 115 is exposed, and impurities 160 are implanted via the opening 115 using the third photoresist pattern 155 as an ion implantation mask, to thereby form a lightly doped region 165 in the silicon substrate 110. For example, As ions or P ions are implanted at a dose of about $10^{15}$ ions/cm$^2$.

Figure 7:
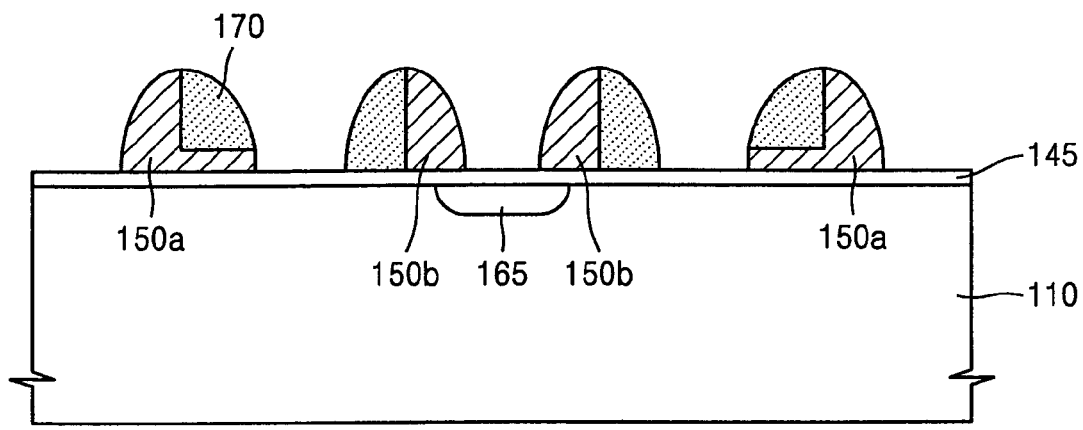

Referring to FIG. 7, the third photoresist pattern 155 is removed, and an oxide layer having a thickness of 1000 Å to 2000 Å is formed on the entire surface of the resultant structure and anisotropically etched. Thus, a pair of insulating spacers 170 are formed on a sidewall of the floating gate 150a and a sidewall of the dummy pattern 150b which face each other. The extending portion (150c of FIG. 6) of the floating gate 150a extends as much as the length of the insulating spacer 170 formed on the sidewall of the floating gate 150a. The dummy pattern 150b is naturally formed during the formation of the floating gate 150a and performs no electrical function. The reason why the dummy pattern 150b is not removed and left even after the floating gate 150a is formed is to form pairs of insulating spacers 170 as described above. These pairs of insulating spacers 170 are used in a subsequent process to form a control gate in a self-aligned manner. After the pairs of insulating spacers 170 are formed, the dummy pattern 150b may be removed.

Figure 8:
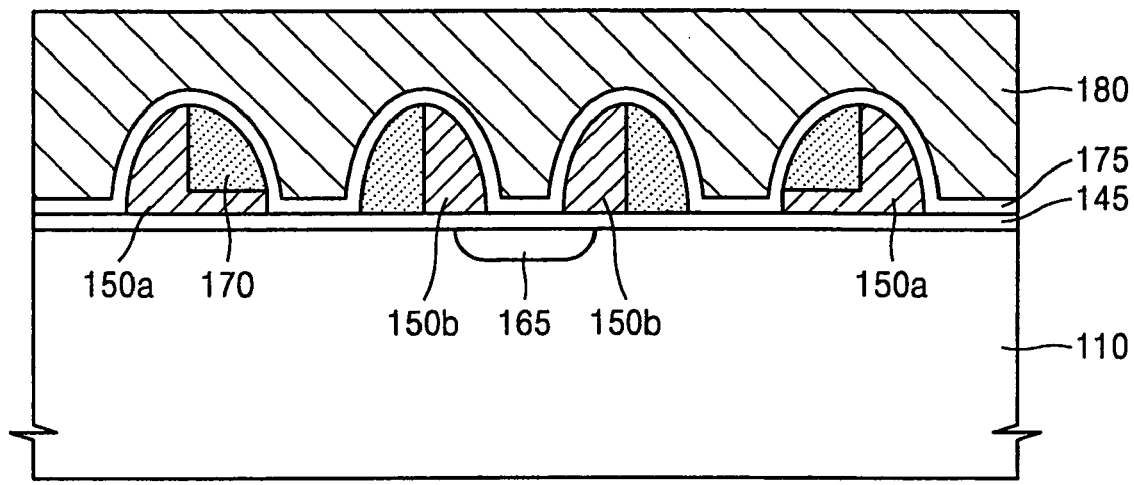

Referring to FIG. 8, a tunnel insulating layer 175 is formed on the pair of the insulating spacers 170. The tunnel insulating layer 175 can be formed by depositing an oxide layer conformally to a thickness of about 50 Å to 200 Å using CVD. Thus, the oxide layer is formed on the surface of the gate insulating layer 145, the floating gate 150a, the dummy pattern 150b, and the pair of insulating spacers 170. Preferably, the deposited oxide layer is thermally treated at a temperature of about 1000° C. for 30 minutes to improve the reliability of the tunnel insulating layer 175. An oxide layer may not be deposited but can be grown using thermal oxidation. Next, a conductive layer 180 is formed on the entire surface of the resultant structure where the tunnel insulating layer 175 is formed. The conductive layer 180 can be a polysilicon layer, a silicide layer, a polycide layer, or a metal layer and is formed to a thickness of about 2000 Å. If the conductive layer 180 is formed of a silicide layer, it may be tungsten silicide, cobalt silicide, or titanium silicide. To form the cobalt silicide or titanium silicide, cobalt or titanium is formed on polysilicon, which is deposited on the resultant structure, and rapid thermal annealing (RTA) is performed to allow the polysilicon to react on the cobalt or titanium. If a cobalt layer is formed as the conductive layer 180, a primary RTA is performed in a N2 atmosphere at a temperature of about 400° C. to 500° C. for about 50 seconds so as to allow polysilicon to react on cobalt. Thus, a CoSi layer is formed. Next, a secondary RTA is performed on the resultant structure in a N2 atmosphere at a temperature of about 800° C. to 900° C. for about 30 seconds. Thus, a $CoSi_2$ layer, which is less resistive than the CoSi layer, is formed. If a nickel layer is formed as the conductive layer 180, a NiSi layer can be obtained by performing one-step thermal treatment at a low temperature. A tungsten silicide layer as the conductive layer 180 can be deposited using CVD. A polycide layer is a stack of the foregoing polysilicon layer and silicide layer.

Figure 9:
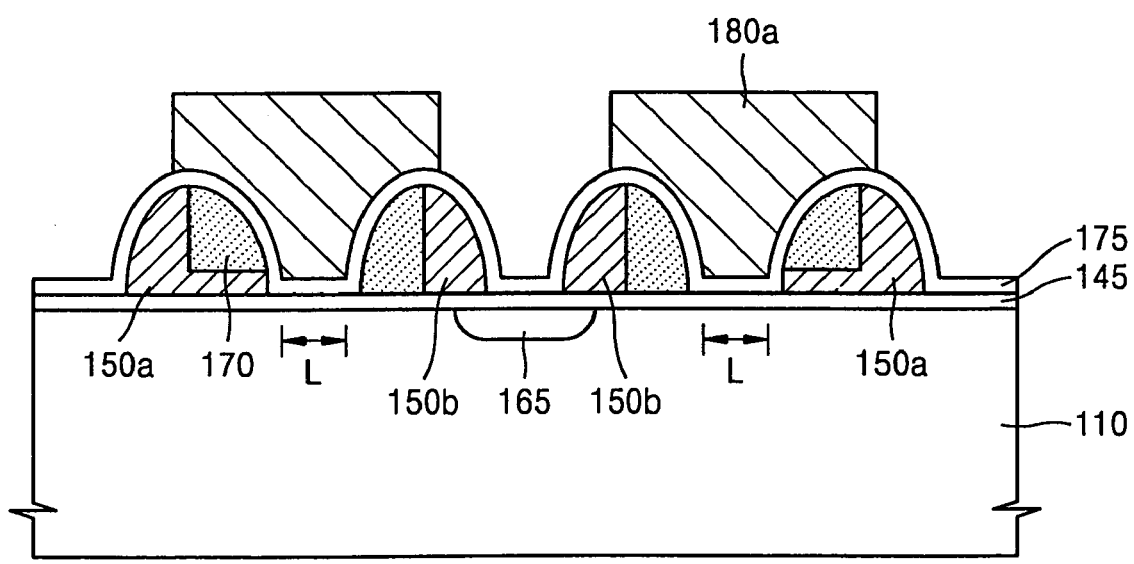

Referring to FIG. 9, a control gate 180a is formed in a self-aligned manner between the pair of insulating spacers 170 by patterning the conductive layer 180. The patterning of the conductive layer 180 is performed not to define the effective channel length of the control gate 180a but to separate the conductive layers 180 of adjacent cells. The effective channel length of the control gate 180a is determined by the shortest distance between the pair of insulating spacers 170. Hence, even if a misalignment occurs during the patterning of the conductive layer 180, the length of a portion of the control gate 180a between the pair of insulating spacers 170, i.e., the effective channel length L, is the same irrespective of the cells. Thus, even if the misalignment occurs, the cells may have uniform characteristics.

Figure 10:
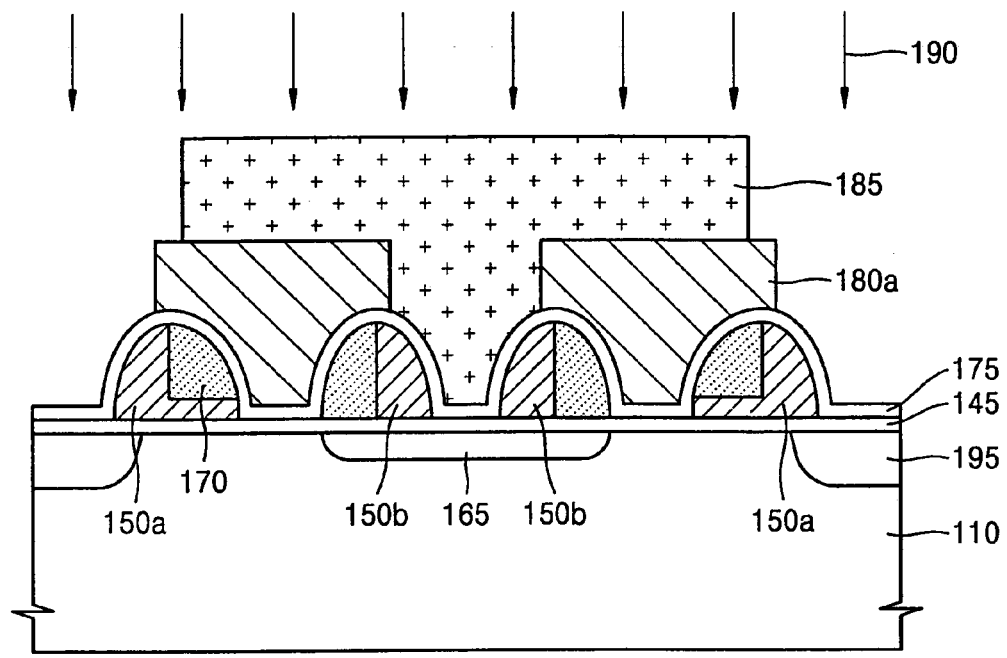

Referring to FIG. 10, a fourth photoresist pattern 185 is formed such that an outer portion of the floating gate 150a is exposed. Impurities 190 are implanted into the silicon substrate 110 using the fourth photoresist pattern 185 as an ion implantation mask, to thereby form a source and drain region 195. For example, As ions or P ions are implanted at a dose of about $10^{16}$ ions/cm$^2$. The fourth photoresist pattern 185 is removed, and the resultant structure is thermally treated to drive in the impurities to cause the source and drain region 195 to be overlapped by the floating gate 150a and the lightly doped region 165 to be overlapped by the control gate 180a. To facilitate the understanding, the fourth photoresist pattern 185 is shown in FIG. 10. In particular, the reason why the lightly doped region 165 is formed beforehand as described with reference to FIG. 6 is as follows. The lightly doped region 165 is continuously exposed to thermal processes while the pair of insulating spacers 170 are being formed as described with reference to FIG. 7 and the conductive layer 180 is being formed as described with reference to FIG. 8. Thus, during the processes described with FIG. 10, the lightly doped region 165 may gradually diffuse to be overlapped by the control gate 180 even with slight thermal treatment or even without additional thermal treatment. Hence, when the lightly doped region 165 is overlapped by the control gate 180*a*, a channel-off region, which is generated by the dummy pattern 150*b* unless the lightly doped region 165 overlaps the control gate 180*a*, can be prevented.

Figure 11:
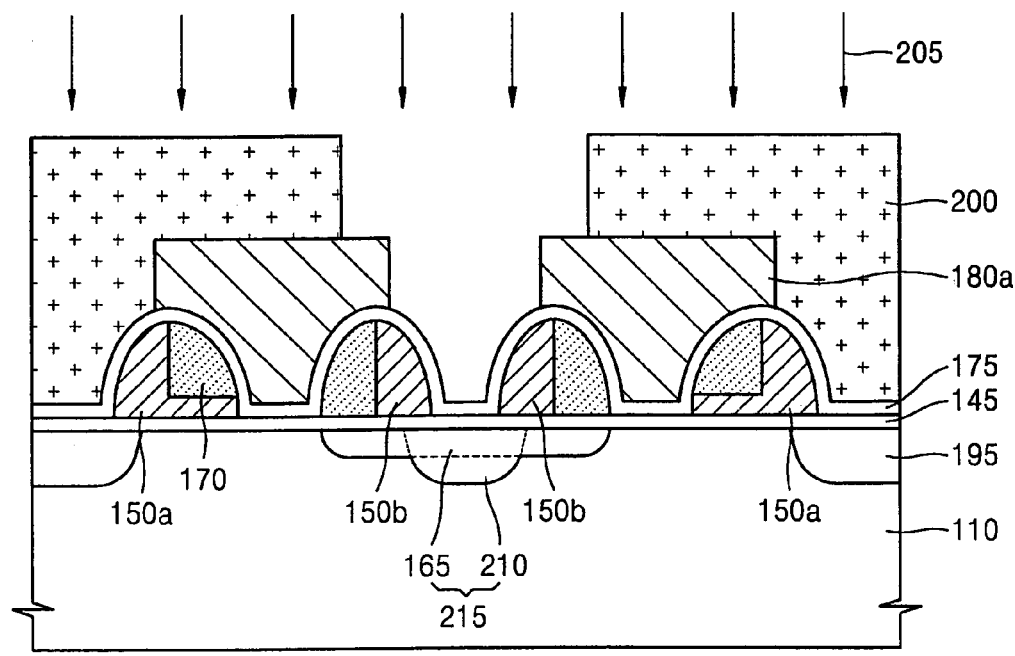

Referring to FIG. 11, a fifth photoresist pattern 200 is formed such that the lightly doped region 165 is exposed, and impurities 205 are implanted into the silicon substrate 110 using the fifth photoresist pattern 200 as an ion implantation mask, to thereby form a heavily doped region 210, which is overlapped by the lightly doped region 165. For example, As ions or P ions are implanted at a dose of about $10^{16}$ ions/cm$^2$. Thus, an LDD-type source and drain region 215 is formed between two control gates 180*a*. Subsequently, the LDD-type source and drain region 215 is electrically connected to a bit line.

Figure 12:
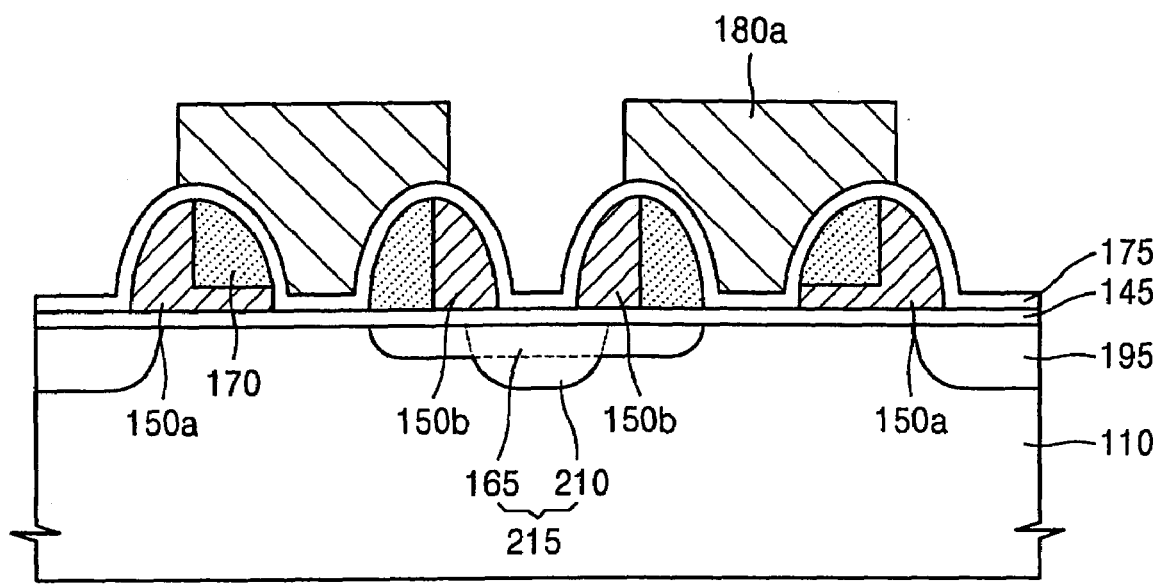

Next, the fifth photoresist pattern 200 is removed. Thus, the structure shown in FIG. 12 is completed. As shown in FIG. 12, the split-gate memory device according to an embodiment of the invention includes the gate insulating layer 145 formed on the semiconductor substrate 110. The spacer-type floating gate 150*a* and the spacer-type dummy pattern 150*b* are formed on the gate insulating layer 145 and separated apart from each other and have round surfaces that face outward. The pair of insulating spacers 170 are formed on the sidewall of the floating gate 150*a* and the sidewall of the dummy pattern 150*b* which face each other. The control gate 180*a* is formed in a self-aligned manner between the pair of insulating spacers 170. The floating gate 150*a* and the control gate 180*a* are separated apart from each other by the tunnel insulating layer 175. The source and drain regions 195 and 215 are formed in the semiconductor substrate 110 outside the floating gate 150*a* and the dummy pattern 150*b*, respectively. The source and drain region 195 formed outside the floating gate 150*a* overlaps the floating gate 150*a*, and the LDD-type source and drain region 215 formed outside the dummy pattern 150*b* is overlapped by the control gate 180*a*. Also, the split-gate memory device is disposed symmetrically in a mirror-image relation perpendicular to the LDD-type source and drain region 215 formed between adjacent dummy patterns 150*b*.

Figure 13:
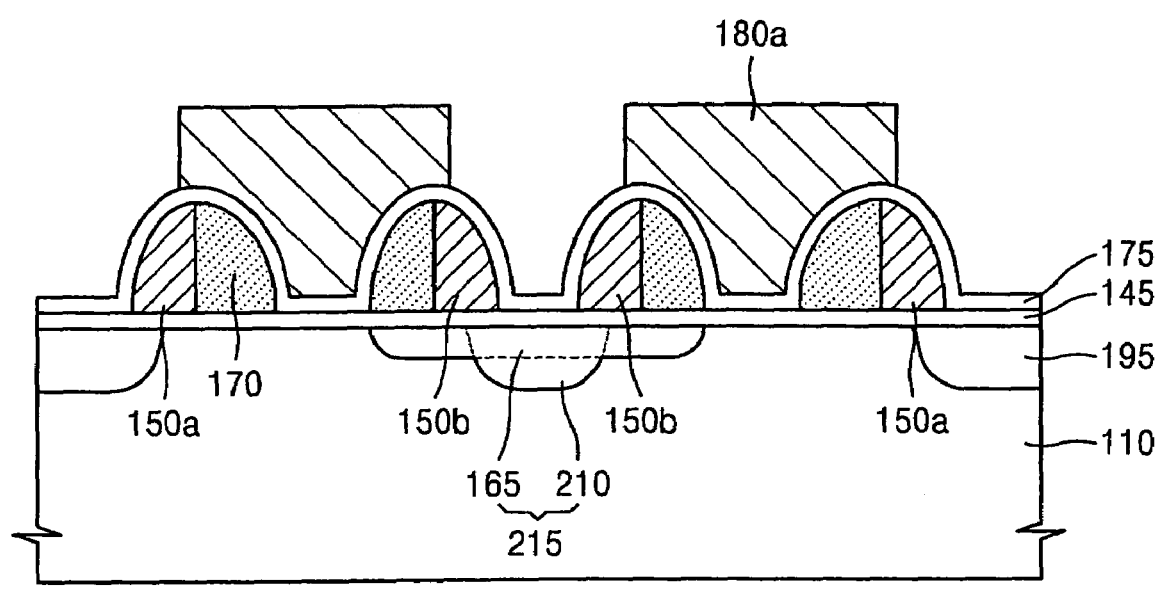
FIG. 13 is a cross-sectional diagram illustrating a split-gate nonvolatile semiconductor memory device according to another embodiment of the invention.

FIG. 13 is a cross-sectional diagram illustrating a split-gate nonvolatile semiconductor memory device according to another embodiment of the invention. In FIG. 13, unlike the floating gate 150*a* of FIG. 6, a floating gate 150*a* does not have an extending portion. If the floating gate 150*a* can secure a sufficient length without the extending portion, the structure of FIG. 13 can be obtained in the same manner as in the first embodiment without performing the forming of the undercut 140 as described with reference to FIG. 3. In this embodiment, an insulating pattern 130 of FIG. 2 need not be formed of a stack of two or more material layers.

Figure 14:
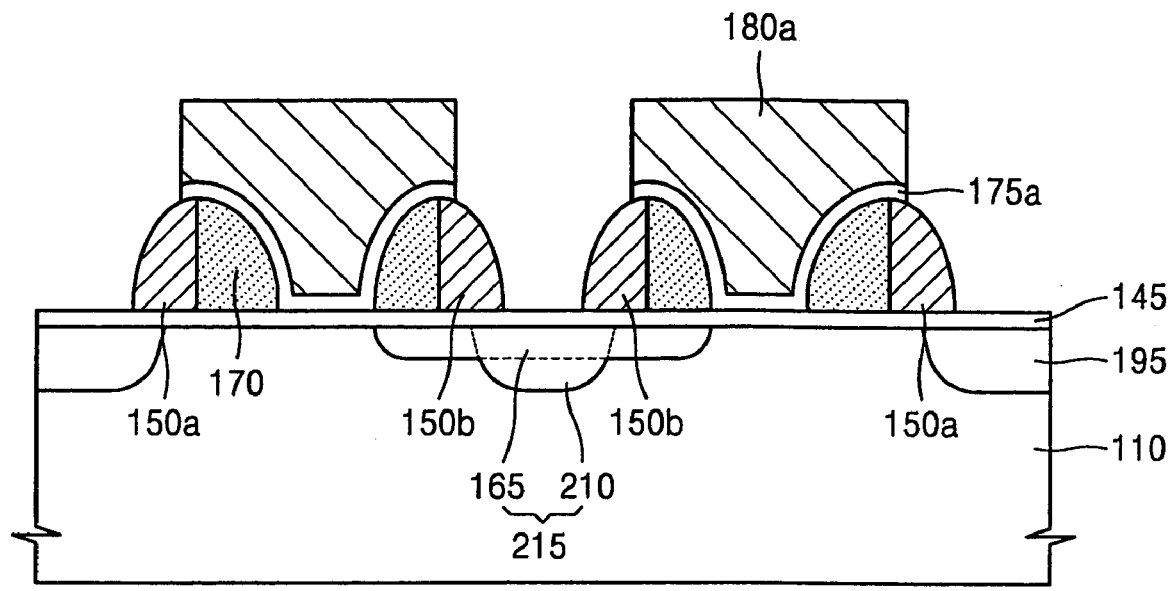
FIG. 14 is a cross-sectional diagram illustrating a split-gate nonvolatile semiconductor memory device according to yet another embodiment of the invention.

FIG. 14 is a cross-sectional diagram illustrating a split-gate nonvolatile semiconductor memory device according to yet another embodiment of the invention. The embodiment is similar to the first embodiment except that while a control gate 180*a* is being formed or after the control gate 180*a* is formed, a tunnel insulating layer 175 is patterned. Reference character 175*a* denotes a patterned tunnel insulating layer.

Figure 15:
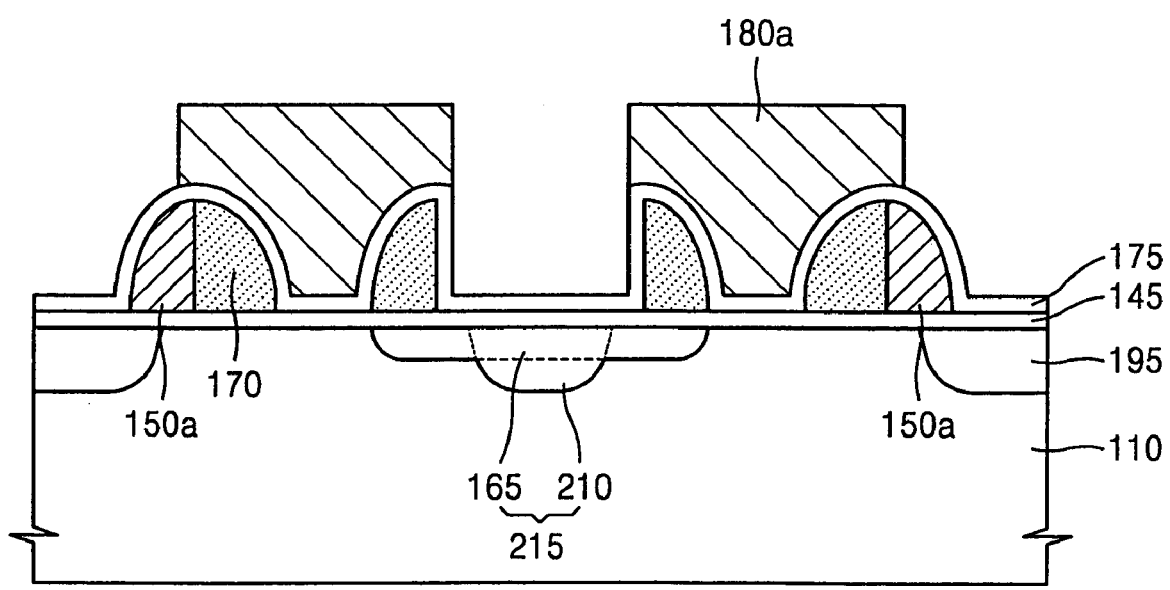
FIG. 15 is a cross-sectional diagram illustrating a split-gate nonvolatile semiconductor memory device according to still another embodiment of the invention.

FIG. 15 is a cross-sectional diagram illustrating a split-gate nonvolatile semiconductor memory device according to still another embodiment of the invention. This embodiment is similar to the first embodiment except that after a pair of insulating spacers 170 are formed, a dummy pattern (150*b* of FIG. 7) is removed. The dummy pattern can be removed during any subsequent process after the pair of the insulating spacers 170 is formed.

Figure 16:
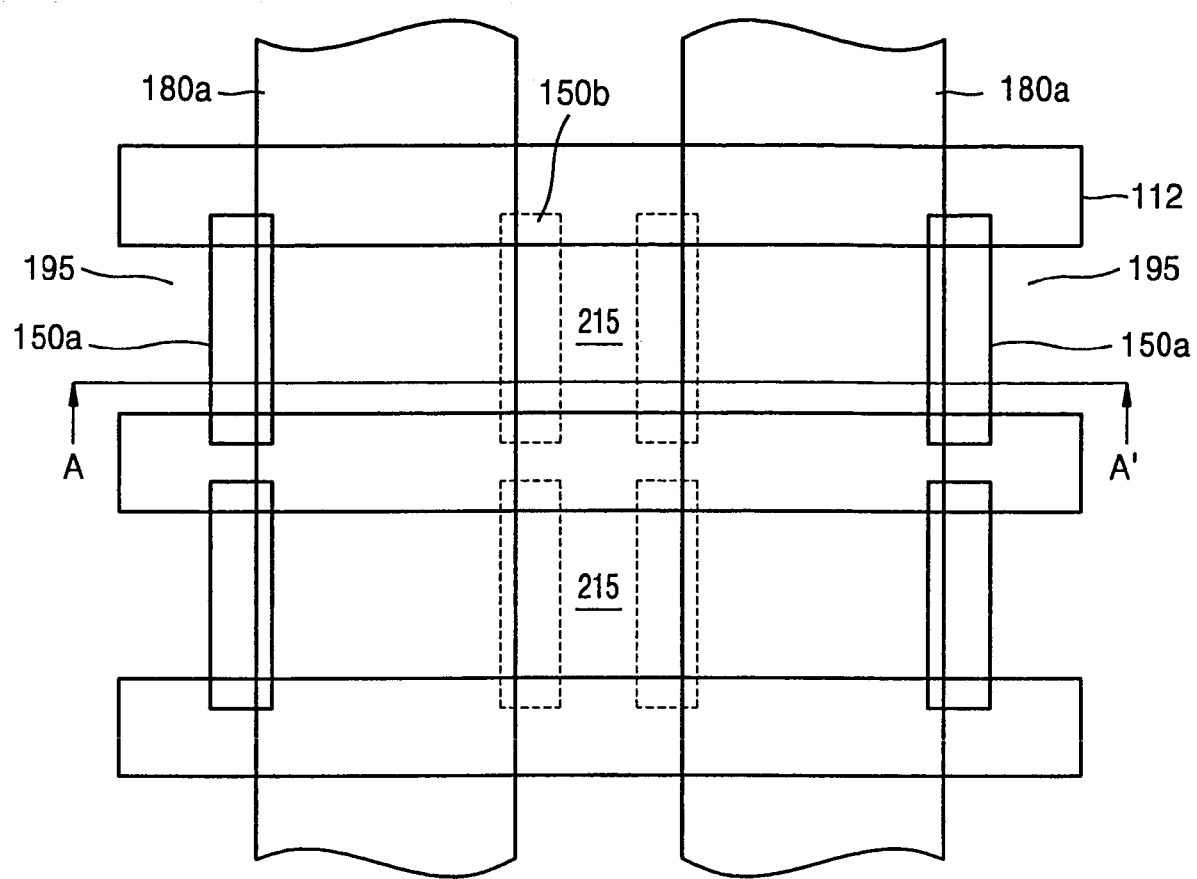
FIG. 16 is a plan diagram illustrating a layout of the embodiments of the invention shown in FIGS. 12 through 15.

FIG. 16 is a plan diagram illustrating the layout of the split-gate nonvolatile semiconductor memory devices according to the above embodiments of the invention. In FIG. 16, reference numeral 112 is an isolation layer. The floating gate 150*a*, the control gate 180*a*, and the source and drain regions 195 and 215 are disposed as illustrated with solid lines. The dummy pattern 150*b* illustrated with dotted lines may be omitted in a final structure. In FIG. 16, the section taken along line A–A' corresponds to FIGS. 12 through 15.

The embodiments of the invention described above use a self-alignment process instead of a photolithography process that may cause a misalignment. Thus, a variation in the length of a control gate can be minimized. Accordingly, cells can have uniform operating characteristics.

Furthermore, since a floating gate is formed using a spacer forming process, a memory cell is not affected by the exposure limit of a photolithography process and can be greatly scaled down. The size of the floating gate can be changed by controlling the size of a spacer and/or the length of an extending portion of the spacer.

Embodiments of the invention may be practiced in many ways. What follows are exemplary, non-limiting descriptions of embodiments of the invention.

According to some embodiments of the invention, there is provided a split-gate nonvolatile semiconductor memory device that includes a gate insulating layer formed on a semiconductor substrate; a spacer-type floating gate and a spacer-type dummy pattern, which are formed on the gate insulating layer and separated apart from each other, the floating gate and the dummy pattern having round surfaces that face outward; a pair of insulating spacers, which are formed on a sidewall of the floating gate and a sidewall of the dummy pattern which face each other; a control gate formed in a self-aligned manner between the pair of insulating spacers; a tunnel insulating layer interposed between the floating gate and the control gate; and source and drain regions formed in the semiconductor substrate outside the floating gate and the dummy pattern.

The floating gate may include an extending portion, which is formed on the opposite side of the round surface of the floating gate and covers a portion of the gate insulating layer. The size of the floating gate corresponds to the sum of the lengths of the spacer and the extending portion. The extending portion can extend as much as the length of the insulating spacer formed on the sidewall of the floating gate. The source and drain region formed outside the floating gate may be overlapped by the floating gate, and the source and drain region formed outside the dummy pattern may be overlapped by the control gate. The gate insulating layer can be a thermal oxide layer, the floating gate can be formed of polysilicon, the insulating spacer can be an oxide spacer, and the control gate can be formed of polysilicon, silicide, polycide, or metal.

The split-gate nonvolatile semiconductor memory device can further include another split-gate memory device, which is disposed symmetrically in a mirror-image relation perpendicular to the source and drain region formed outside the dummy spacer.

According to other embodiments of the invention, there is provided a method of manufacturing a split-gate nonvolatile semiconductor memory device. The method includes forming a gate insulating layer on a semiconductor substrate; forming a spacer-type floating gate and a spacer-type dummy pattern on the gate insulating layer, the floating gate and the dummy pattern being separated apart from each other and having round surfaces that face outward; forming a pair of insulating spacers on a sidewall of the floating gate and a sidewall of the dummy pattern which face each other; forming a tunnel insulating layer on the pair of insulating spacers; forming a control gate in a self-aligned manner between the pair of insulating spacers; and forming source and drain regions in the semiconductor substrate outside the floating gate and the dummy pattern.

The floating gate may include an extending portion, which is formed on the opposite side of the round surface of the floating gate and covers a portion of the gate insulating layer. The size of the floating gate can be changed by controlling the lengths of a spacer and the extending portion. After forming the pair of insulating spacers, the method can further include removing the dummy pattern.

According to other embodiments of the invention, there is provided a method of manufacturing a split-gate nonvolatile semiconductor memory device. The method includes forming insulating patterns on a semiconductor substrate, the insulating patterns being separated by an opening; forming undercuts by removing portions of lower portions of the insulating patterns, which are positioned on the opposite side of the opening; forming a gate insulating layer on the entire surface of the semiconductor substrate between the semiconductor substrate and the insulating patterns; forming a spacer-type floating gate and a spacer-type dummy pattern on sidewalls of the insulating patterns; removing the insulating patterns; forming a lightly doped region by implanting impurities into the semiconductor substrate via the opening; forming a pair of insulating spacers on a sidewall of the floating gate and a sidewall of the dummy pattern which face each other; forming a tunnel insulating layer on the pair of insulating spacers; forming a control gate in a self-aligned manner between the pair of insulating spacers; forming a source and drain region by implanting impurities into the semiconductor substrate outside the floating gate; and forming a lightly-doped-drain-type source and drain region by forming a heavily doped region that overlaps the lightly doped region.

Each of the insulating patterns can be formed of a stack of an oxide layer and a nitride layer, and the undercuts are formed by etching the oxide layer using a wet etch process. The floating gate can be formed so as to fill the undercuts. The size of the floating gate can be controlled by adjusting the depth of the undercuts. The gate insulating layer can be formed of a thermal oxide layer, the floating gate can be formed of polysilicon, and the insulating spacer can be formed of an oxide layer. The tunnel insulating layer can be formed to a thickness of about 50 Å to 200 Å. After forming the source and drain region, the method can further include performing thermal treatment to drive in the impurities to make the source and drain region overlap the floating gate and the lightly doped region overlap the control gate. The control gate can be formed of polysilicon, silicide, polycide, or metal. The silicide can be tungsten silicide, cobalt silicide, or titanium silicide.

While the invention has been particularly shown and described with reference to preferred embodiments thereof, it will be understood by those of ordinary skill in the art that various changes in form and details may be made therein without departing from the spirit and scope of the invention as defined by the attached claims.

We claim:

1. A method of manufacturing a split-gate nonvolatile semiconductor memory device, the method comprising:
   forming insulating patterns on a semiconductor substrate, the insulating patterns separated by an opening;
   forming undercuts in lower portions of the insulating patterns, each undercut positioned on a side of the insulating pattern opposite to the opening;
   forming a gate insulating layer on a surface of the semiconductor substrate between the semiconductor substrate and the insulating patterns;
   forming a spacer-type floating gate and a spacer-type dummy pattern on sidewalls of the insulating patterns;
   removing the insulating patterns;
   forming a lightly doped region by implanting impurities into the semiconductor substrate via the opening;
   forming a pair of insulating spacers on a sidewall of the floating gate and a sidewall of the dummy pattern which face each other;
   forming a tunnel insulating layer on the pair of insulating spacers;
   forming a control gate in a self-aligned manner between the pair of insulating spacers;
   forming a source and drain region by implanting impurities into the semiconductor substrate outside the floating gate; and
   forming a lightly-doped-drain-type source and drain region by forming a heavily doped region that overlaps the lightly doped region.

2. The method of claim 1, wherein each of the insulating patterns is formed of a stack of two or more layers, which have a high etch selectivity with respect to each other, and the undercuts are formed by etching a lowest layer of each of the insulating patterns.

3. The method of claim 1, wherein forming the insulating patterns comprises sequentially stacking an oxide layer and a nitride layer, and wherein forming undercuts comprises etching the oxide layer using a wet etch process.

4. The method of claim 1, wherein forming the spacer-type floating gate comprises filling the undercuts.

5. The method of claim 4, wherein forming the spacer-type floating gate further comprises controlling a size of the spacer-type floating gate by adjusting the depth of the undercuts.

6. The method of claim 1, wherein forming the gate insulating layer comprises forming a thermal oxide layer.

7. The method of claim 1, wherein forming the spacer-type floating gate comprises forming the spacer-type floating gate of polysilicon.

8. The method of claim 1, wherein forming the pair of insulating spacers comprises forming the pair of insulating spacers of an oxide layer.

9. The method of claim 1, further comprising, after forming the source and drain region, performing thermal treatment to drive in the impurities to make the floating gap overlap the source and drain region and the control gate overlap the lightly doped region.

10. The method of claim 1, wherein forming the control gate comprises forming the control gate of one selected from the group consisting of polysilicon, silicide, polycide, and a metal.

* * * * *